(12) United States Patent
Ishikawa

(10) Patent No.: US 10,381,099 B2
(45) Date of Patent: *Aug. 13, 2019

(54) TEST MODE CIRCUIT FOR MEMORY APPARATUS

(71) Applicant: MICRON TECHNOLOGY, INC., Boise, ID (US)

(72) Inventor: Toru Ishikawa, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 51 days.

This patent is subject to a terminal disclaimer.

(21) Appl. No.: 15/841,148

(22) Filed: Dec. 13, 2017

(65) Prior Publication Data
US 2018/0108429 A1 Apr. 19, 2018

Related U.S. Application Data

(63) Continuation of application No. 14/981,180, filed on Dec. 28, 2015, now Pat. No. 9,852,809.

(51) Int. Cl.
G11C 29/42 (2006.01)
G11C 11/4091 (2006.01)
G11C 11/4094 (2006.01)
G11C 29/44 (2006.01)
G06F 11/10 (2006.01)
G11C 7/10 (2006.01)
G11C 29/56 (2006.01)

(52) U.S. Cl.
CPC ............. G11C 29/42 (2013.01); G06F 11/10 (2013.01); G06F 11/1048 (2013.01); G11C 11/4091 (2013.01); G11C 11/4094 (2013.01); G11C 29/44 (2013.01); G11C 29/4401 (2013.01); G11C 7/1006 (2013.01); G11C 2029/5602 (2013.01)

(58) Field of Classification Search
CPC ....... G11C 29/42; G11C 29/025; G11C 29/44; G11C 7/08; G11C 29/4402; G11C 7/1006; G06F 11/10; G06F 11/1048
See application file for complete search history.

(56) References Cited

U.S. PATENT DOCUMENTS 6,829,737 B1 * 12/2004 McBride ............ G01R 31/2894
365/201
7,461,327 B2 12/2008 Kim et al.
7,876,634 B2 * 1/2011 New ........................ G11C 7/08
365/189.04
8,117,520 B2 2/2012 Baker
9,852,809 B2 12/2017 Ishikawa
(Continued)

Primary Examiner — Shelly A Chase
(74) Attorney, Agent, or Firm — Dorsey & Whitney LLP

(57) ABSTRACT

Apparatuses for error detection and correction for a semiconductor device are described. An example apparatus includes: at least one memory cell array including a plurality of memory cells; and a control circuit that receives read data from the plurality of memory cells, compares the read data with reference data, and further provides an error signal. The control circuit further provides the error signal when a number of bit errors detected is greater than or equal to a predetermined number, and suppresses providing the error signal when the number of bit errors detected is less than the predetermined number.

20 Claims, 8 Drawing Sheets

(56) References Cited

U.S. PATENT DOCUMENTS

| | | | |
|---|---|---|---|
| 2003/0043664 A1* | 3/2003 | Haraguchi | G11C 29/44 |
| | | | 365/201 |
| 2012/0120705 A1* | 5/2012 | Mitsubori | G11C 29/025 |
| | | | 365/72 |
| 2016/0011940 A1 | 1/2016 | Hu et al. | |
| 2016/0283318 A1 | 9/2016 | Das et al. | |
| 2017/0186499 A1 | 6/2017 | Ishikawa | |

* cited by examiner

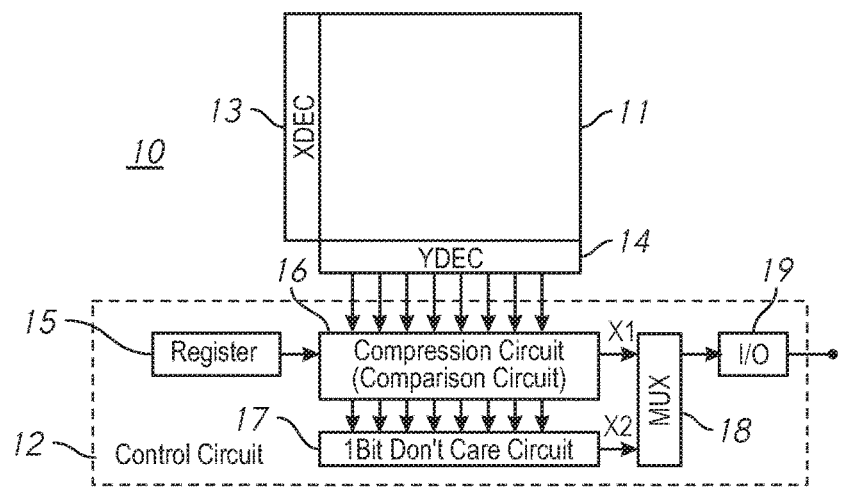
*FIG. 3A*
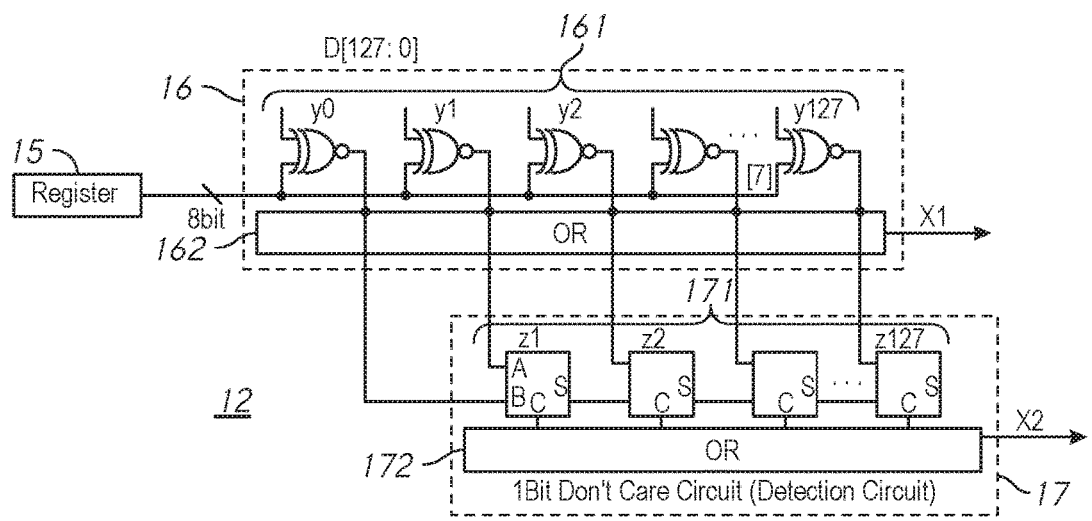
*FIG. 3B*
| A | B | C | S |
|---|---|---|---|
| 0 | 0 | 0 | 0 |
| 0 | 1 | 0 | 1 |
| 1 | 0 | 0 | 1 |
| 1 | 1 | 1 | 0 |
*FIG. 4*

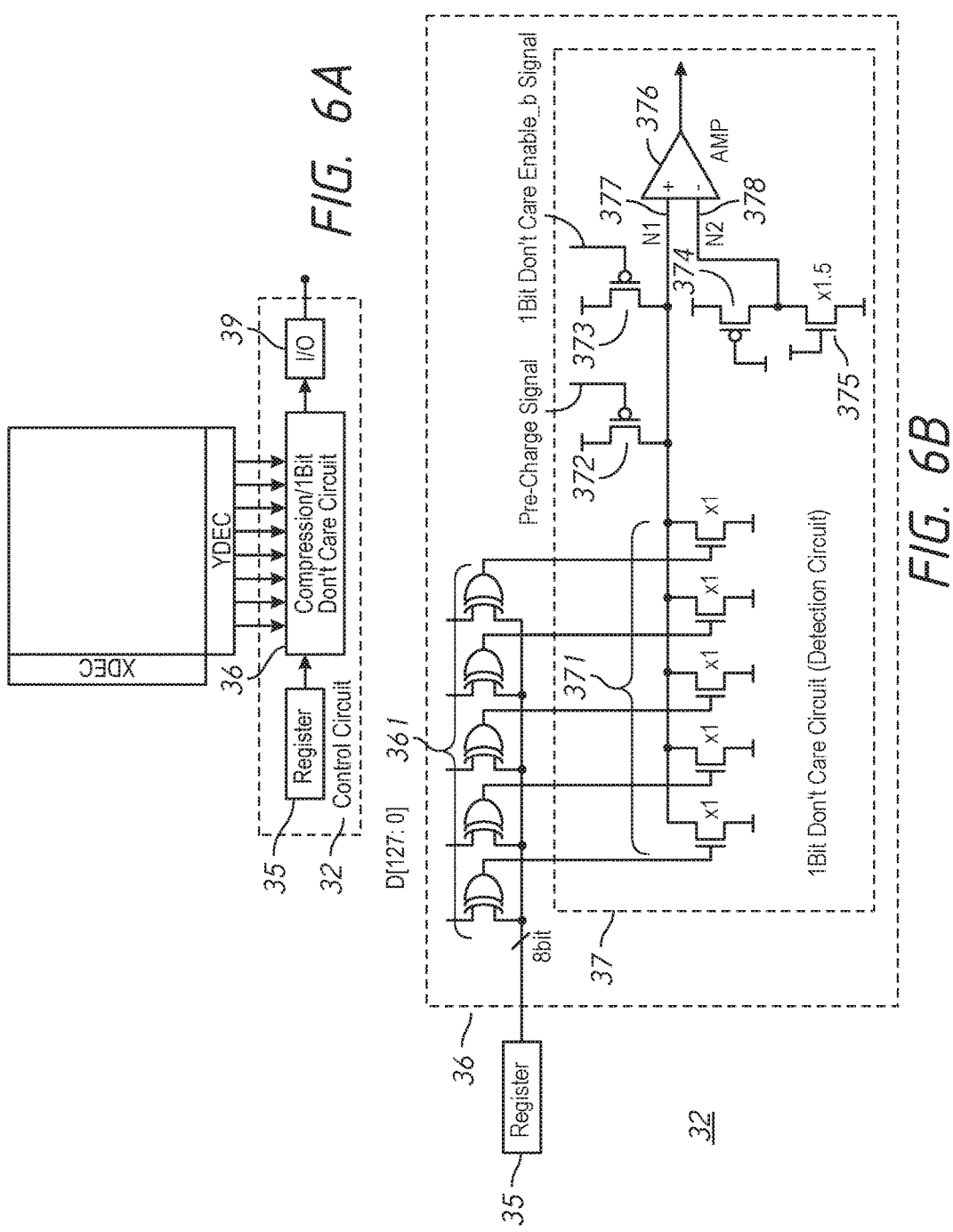

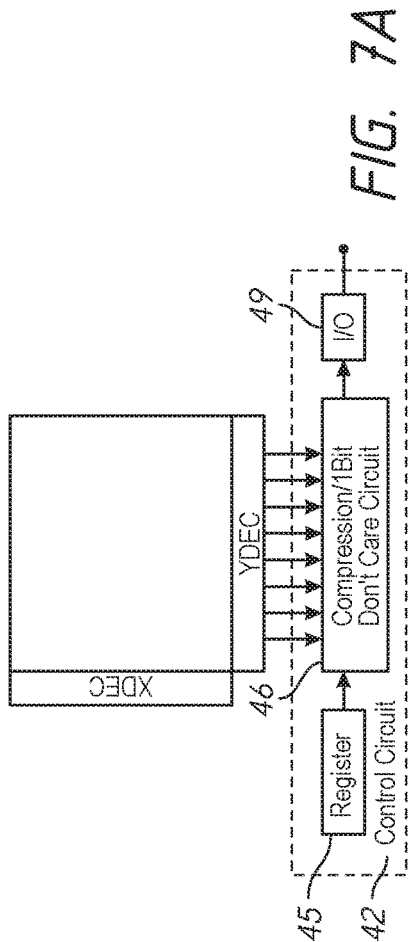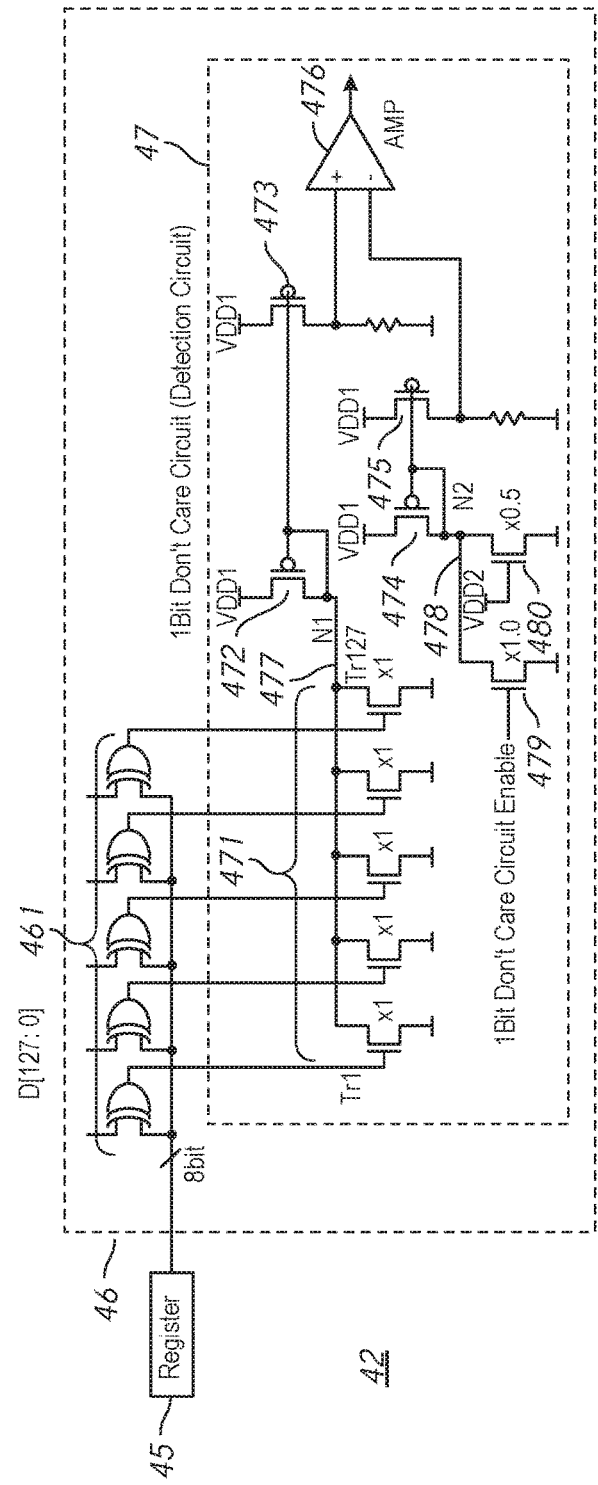
FIG. 7A
FIG. 7B

TEST MODE CIRCUIT FOR MEMORY APPARATUS

CROSS REFERENCE TO RELATED APPLICATION(S)

This application is a continuation of U.S. patent application Ser. No. 14/981,180 filed Dec. 28, 2015 and issued as U.S. Pat. No. 9,852,809 on Dec. 26, 2017. The aforementioned application, and issued patent, is incorporated herein by reference, in its entirety, for any purpose.

BACKGROUND

In a semiconductor memory device, memory cells may be susceptible to errors based on a transient error or a soft error. The errors may be due to a transient error caused by noises from surrounding components in the device with high-density. Soft errors may be caused by background radiation. Memories have been developed that include error detection and/or error correcting codes (ECC) to correct these errors.

A compression circuit in the semiconductor memory device may execute a test mode referred to as a "compression mode" for dynamic random access memory (DRAM), in order to detect and correct errors. In the compression mode, for example, data of 128 bits may be divided into sixteen sets of 8-bit data and each set of 8-bit data is compared with an internal register value (eight bits). FIG. 1A is an example of a semiconductor memory device with the compression mode. FIG. 1B is a schematic diagram of a compression circuit in FIG. 1A. In a write operation, 128 bits may be written by setting sixteen sets of 8-bit data to a memory cell array. In a read operation, read data of sixteen sets are compared with data in a register on the 8-bit unit basis so that the matched results are collectively outputted by an OR circuit. That is, if there merely is a 1-bit mismatch in the read data, the mismatch may still be detected as an error and the detected one bit error leads to a fail result of the read data in this configuration.

FIG. 2 is a schematic diagram of a DRAM chip and a controller chip. As shown in FIG. 2, a controller chip, such as a system-on-chip (SoC), may also include a built-in ECC circuit and syndromes and data are exchanged between the DRAM chip and the SoC. In this system configuration, the system is able to execute data processing regardless of some defective portions of data (e.g. data including single bit errors). For example, the DRAM chip that has an error(s) may be nonetheless usable in the system if the SoC has correction capability for the error. Thus, a test mode which ignores some errors may maximize a yield on a wafer and may be desired.

BRIEF DESCRIPTION OF THE DRAWINGS

FIG. 3A is a block diagram of a memory cell array and a control circuit in a semiconductor memory device according to an embodiment of the present disclosure.

FIG. 3B is a schematic diagram of a portion of the control circuit in FIG. 3A according to an embodiment of the present disclosure.

FIG. 4 is a table showing relationships among logic values of nodes of each half-adder circuit of a detection circuit of FIG. 3B according to an embodiment of the present disclosure.

FIG. 6A is a block diagram of a memory cell array and a control circuit in a semiconductor memory device according to an embodiment of the present disclosure.

FIG. 6B is a schematic diagram of a portion of the control circuit in FIG. 6A according to an embodiment of the present disclosure.

FIG. 7A is a block diagram of a memory cell array and a control circuit in a semiconductor memory device according to an embodiment of the present disclosure.

FIG. 7B is a schematic diagram of a portion of the control circuit in FIG. 7A according to an embodiment of the present disclosure.

DETAILED DESCRIPTION OF PREFERRED EMBODIMENTS

Figure 1A:
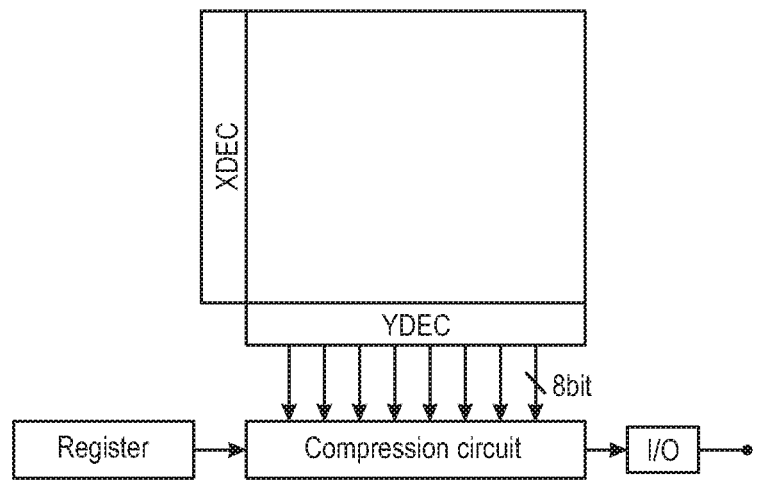
FIG. 1A is an example of a semiconductor memory device with the compression mode.
Figure 1B:
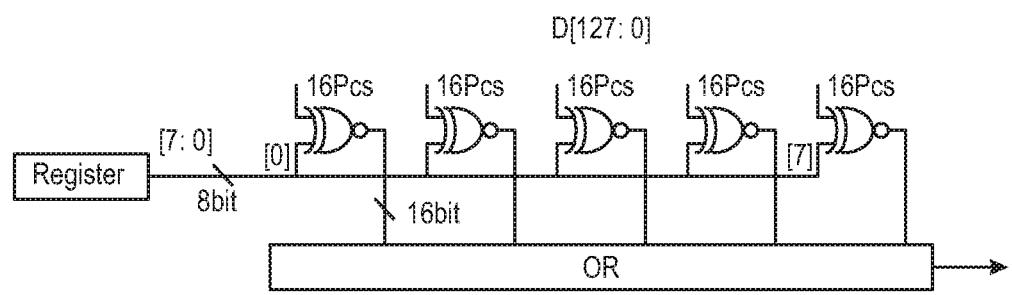
FIG. 1B is a schematic diagram of a compression circuit in FIG. 1A.
Figure 2:
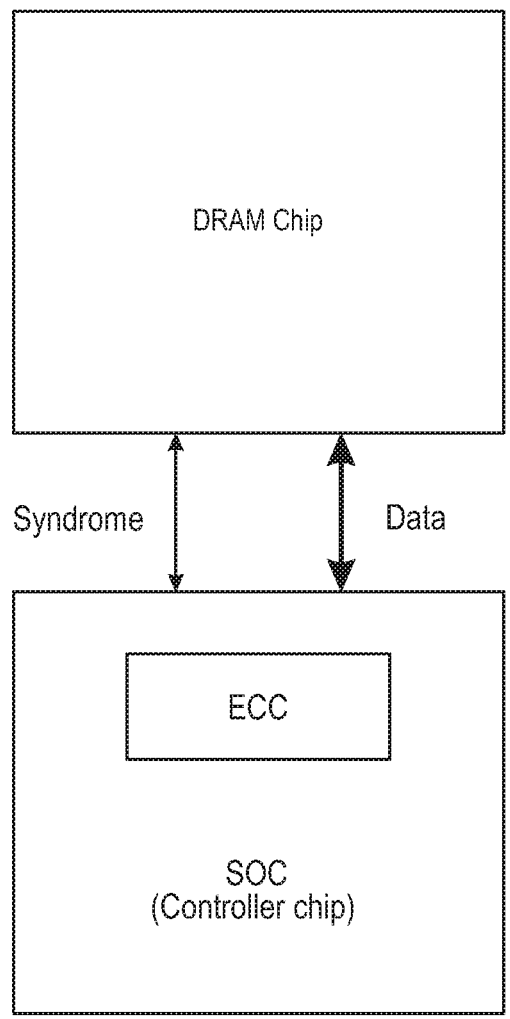
FIG. 2 is a schematic diagram of a DRAM chip and a controller chip.

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

FIG. 3A is a block diagram of a memory cell array and a control circuit in a semiconductor memory device according to an embodiment of the present disclosure. The semiconductor memory device may be a DRAM integrated into a single semiconductor chip, for example, however, other devices may also be the semiconductor memory device of the present disclosure. The semiconductor memory device 10 may be mounted on a memory module substrate, a mother board or the like (not shown). The semiconductor memory device 10 includes a memory cell array 11 and a control circuit 12. The memory cell array 11 may include a plurality of word lines, a plurality of bit lines, and a plurality of memory cells arranged at intersections of the plurality of word lines and the plurality of bit lines. The selection of the word line is performed by a row decoder (XDEC) 13 and the selection of the bit line is performed by a column decoder (YDEC) 14. The control circuit 12 includes a register 15, a compression circuit 16 which functions as a first comparison circuit, a 1-bit don't care circuit 17 (also referred to "a detection circuit") which functions as a second comparison circuit, a multiplexer 18 which receives an output signal from the compression circuit 16 and an output signal from the 1-bit don't care circuit 17, and an input/output circuit 19 which receives an output signal of the multiplexer 18.

FIG. 3B is a schematic diagram of an example of a portion of the control circuit 12 in FIG. 3A according to an embodiment of the present disclosure. FIG. 3B shows a detail circuit configuration of the control circuit. The control circuit 12 provides error detection of two or more bit errors while ignoring single bit errors that may be handled by an ECC circuit outside of the control circuit 12. In a test operation, a plurality of bits (e.g., 128 bits) of read data are read from the memory cell array 11 and provided to the compression circuit 16. The compression circuit 16 includes an XOR circuit 161. The XOR circuit 161 includes a plurality of respective exclusive-OR (XOR) logic circuits, y0, y1, . . . y127 that compare the plurality of bits of data with reference data (e.g. expectation data) from the register 15. The number of XOR logic circuits is the number of the data bits (e.g., 128). In this embodiment, the reference data has eight bits, which means each bit among the eight bits is commonly used to represent a corresponding sixteen bits of 128 bits of read data. However, in other embodiments, a different number of bits (e.g., 4 or 16, etc.) may be used. With reference data with a greater number of bits, a test operation with more complex memory cell data patterns may be executed. The compression circuit 16 may include a first OR circuit 162 which provides a first error signal when the first OR circuit 162 detects that at least one XOR logic circuit of the XOR circuit 161 provides a first intermediate error signal having a first logic level (e.g., logic high).

At the same time, the 1 Bit Don't Care circuit 17 may provide a second error signal having the first logic level when the first OR circuit 162 detects that at least two XOR logic circuits of the XOR circuit 161 provides the first intermediate error signals having the first logic level. The 1 Bit Don't Care circuit 17 includes a half-adder circuit 171 and a second OR circuit 172. The half-adder circuit 171 includes a plurality of half-adders z1, z2, . . . , z127 that are serially coupled. FIG. 4 is a table showing relationships among logic values of nodes of each half-adder circuit 171 of a detection circuit of FIG. 3B according to an embodiment of the present disclosure.

Each half-adder circuit 171 activates a sum node ("S") when at least one of input nodes (e.g., "A" and "B") is at a first logic level (e.g., logic high) indicative of at least one bit error. Simultaneously, each half-adder circuit 171 activates a carry node ("C") when both "A" and "B" nodes are at the first logic level. For example, if an XOR logic circuit y0 detects an error and provides one of first intermediate error signal at the first logic level, a half-adder circuit 171 z1 activates its sum node ("S") that activates "S" nodes of the following half-adder circuits z2 to z127 by providing a second intermediate error signal. Under the situation, if the XOR logic circuit y2 detects an error and provides an output signal at the first logic level, the half-adder z2 activates its "C" node because its "B" node of the half-adder z2 coupled to the "S" node of the half-adder z1 has been activated. In this manner, the second OR circuit 172 may be enabled to provide a second error signal when at least two bit errors are detected. Finally, a multiplexer 18 (MUX) provides one of the first error signal and the second error signal received from the compression circuit 16 and the 1 Bit Don't Care circuit 17 as an error signal indicative of a test result. As previously described, the control circuit 12 may use comparison results of the compression circuit 16 and the 1 Bit Don't Care circuit 17 in order to ignore defects due to single bit errors.

In the embodiment above, the control circuit 12 includes two detection blocks, such as the compression circuit 16 for single bit error detection and the 1 Bit Don't Care circuit 17 for detection of multiple bit errors. The output signal of the compression circuit 16 may be included in the semiconductor memory device 10 for a non-ECC system. In some embodiments, it may be possible to omit the first OR circuit 162 for the one bit error detection and the multiplexer (MUX) 18 when the semiconductor memory device 10 is coupled to a controller including an ECC circuit for single-bit error detection and correction. Similarly, the control circuit 12 may be modified to ignore multiple (e.g. N which is an integer equal to or greater than two) bit errors if the ECC circuit of the controller is capable of the multiple bit error correction.

The control circuit 12 may cause delays in providing the comparison result, due to longer time for transmitting carry signals. For example, in the case of 128 bits data, the half-adder circuits 171 of 128 stages results in delayed transmission of the comparison result. By dividing the 128 stages and including OR circuits, the delay may be shortened. However, the size of the control circuit may increase as a result, which is not desirable.

Figure 5A:
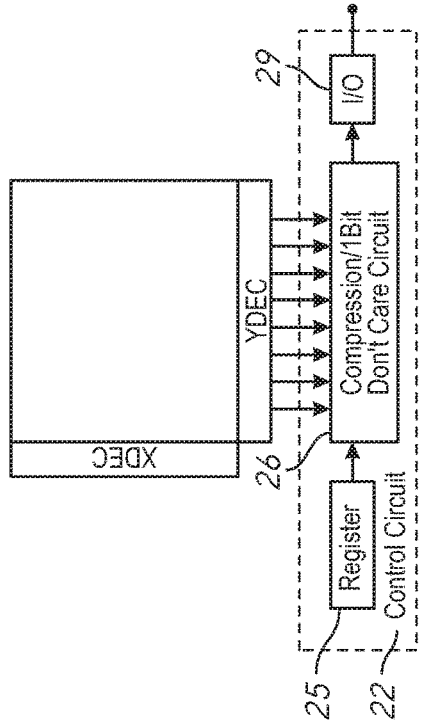
FIG. 5A is a block diagram of a memory cell array and a control circuit in a semiconductor memory device according to an embodiment of the present disclosure.
Figure 5B:
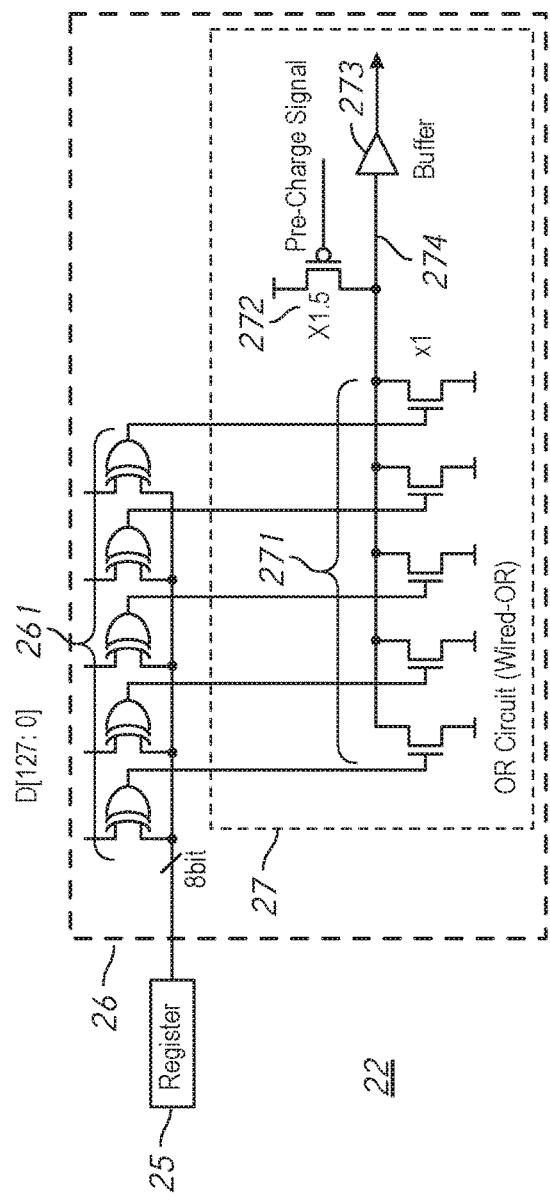
FIG. 5B is a schematic diagram of a portion of the control circuit in FIG. 5A according to an embodiment of the present disclosure.

FIG. 5A is a block diagram of a memory cell array and a control circuit in a semiconductor memory device according to an embodiment of the present disclosure. FIG. 5B is a schematic diagram of a portion of the control circuit 22 in FIG. 5A according to an embodiment of the present disclosure. FIG. 5B shows a detail circuit configuration of the control circuit 22. The control circuit 22 provides error detection of two or more bit errors while ignoring single bit errors that may be, for example, handled by an ECC circuit outside of the control circuit 22. In a test operation, a plurality of bits (e.g., 128 bits) of read data is provided to a compression/1 Bit Don't Care circuit 26. The compression/1 Bit Don't Care circuit 26 includes a plurality of respective exclusive-OR (XOR) circuits 261 that compare the plurality of bits of data with reference data from a register 25. The compression/1 Bit Don't Care circuit 26 may include a wired-OR circuit 27. For example, the wired-OR circuit 27 may include a plurality of N-channel field effect transistors 271 that receives first intermediate error signals of the respective exclusive-OR (XOR) circuits 261. The wired-OR circuit 27 may also include a P-channel field effect transistor 272 which receives a pre-charge signal at an input node thereof. A size of the P-channel field effect transistor 272 is between the size of each of a plurality of N-channel field effect transistors 271 and twice the size of each of the plurality of N-channel field effect transistors 271 (e.g. 1.5 times). The P-channel field effect transistor 272 may supply a threshold current which is greater than a current derived by one of the plurality of N-channel field effect transistors 271 and less than a current derived by two or more of the plurality of N-channel field effect transistors 271. When there is one error bit in 128 bits of the read data, one of the first intermediate error signals which is one output signal of the exclusive-OR (XOR) circuits 261 becomes active (e.g. logic high level) and one of the N-channel field effect transistors 271 becomes active and provides a second intermediate error signal. The current derived by the one of the N-channel field effect transistors 271 is less than the threshold current provided by the P-channel field effect transistor 272. Thus, a node 274 that provides an input signal of a buffer circuit 273 maintains an active level (e.g. logic high level). When there are two or more error bits in the read data, two or more output signals of the exclusive-OR (XOR) circuits 261 becomes active (e.g. logic high level). The current derived by these two N-channel field effect transistors 271 respective to the two or more output signals of the exclusive-OR (XOR) circuits 261 is greater than the threshold current provided by the P-channel field effect transistor 272. As a result, the input signal of the buffer circuit 273 changes from the logic high level to a logic low level. Thus, the control circuit 22 of FIG. 5B may be able to detect two or more bit errors while eliminating delays from the half-adder circuits 171 in FIG. 3B. The wired-OR circuit 27 shown in FIG. 5B is merely an example of a wired-OR circuit that may be used. In other embodiments, different wired-OR circuits may be used. For example, some other channel type of transistors may be used alternatively and/or additionally to the P-channel transistor and the N-channel transistors in FIG. 5B.

FIG. 6A is a block diagram of a memory cell array and a control circuit in a semiconductor memory device according to an embodiment of the present disclosure. FIG. 6B is a schematic diagram of a portion of the control circuit 32 in FIG. 6A according to an embodiment of the present disclosure. In particular, FIG. 6B shows a detail circuit configuration of the control circuit 32. The control circuit 32 provides error detection of two or more bit errors while ignoring single bit errors that may be handled by an ECC circuit outside of the control circuit 32. In a test operation, a plurality of bits (e.g., 128 bits) of read data are provided to a compression/1 Bit Don't Care circuit 36. The compression/1 Bit Don't Care circuit 36 includes a plurality of respective exclusive-OR (XOR) circuits 361 that compare the plurality of bits of data with reference data from a register 35. The compression/1 Bit Don't Care circuit 36 may include a 1BitDon'tCare circuit 37. For example, the 1BitDon'tCare circuit 37 may include a plurality of N-channel field effect transistors 371 that receives output signals of the respective exclusive-OR (XOR) circuits 361. The 1BitDon'tCare circuit 37 may also include a first P-channel field effect transistor 372 which receives a pre-charge signal at an input node thereof. The 1BitDon'tCare circuit 37 may also include a second P-channel field effect transistor 373 which receives a 1BitDon'tCareEnable_b signal at an input node thereof. The 1BitDon'tCareEnable_b signal is indicative of precharging, a pre-charge signal at a logic low level may be provided to an input node of the first P-channel field effect transistor 372. A drain node of the first P-channel field effect transistor 372 is coupled to a first input node N1 377 of a differential amplifier (AMP) 376. Thus, the input node of the AMP 376 may be precharged.

Drain nodes of the plurality of N-channel field effect transistors 371 and a drain node of the second P-channel field effect transistor 373 are coupled to the first input node (N1) 377 of the AMP 376. A drain node of a third P-channel field effect transistor 374 and a drain node of an additional N-channel field effect transistor 375 are coupled to a second input node (N2) 378 of the AMP 376. A combination of the third P-channel field effect transistor 374 and the additional N-channel field effect transistor 375 provides a reference signal to the second input node (N2) 378. The size of the second P-channel field effect transistor 373 and the size of the third P-channel field effect transistor 374 are substantially the same. The size of the additional N-channel field effect transistor 375 is between the size of each of a plurality of N-channel field effect transistors 371 and twice the size of each of the plurality of N-channel field effect transistors 371 (e.g. 1.5 times).

When error detection is activated, the logic level of the pre-charge signal changes from logic low to logic high and a logic level of the 1BitDon'tCareEnable_b signal changes from logic high to logic low. While the error detection is active, the exclusive-OR (XOR) circuits 361 provide comparison result signals. In response to the comparison result signals from the plurality of respective exclusive-OR (XOR) circuits 361, the N1 node 377 changes to an intermediate electric potential when one or more of the plurality of N-channel field effect transistors 371 is activated in response to comparison result signals from the plurality of respective exclusive-OR (XOR) circuits 361. Because the logic level of the 1BitDon'tCareEnable_b signal is logic low, a first voltage of the N1 node 377 is greater than a second voltage of the N2 node 378 when only one of the plurality of N-channel field effect transistors 371 is activated. Thus, an output signal of AMP 376 maintains a logic high level because the first voltage of N1 node 377 is higher than the second voltage of N2 node 378. On the other hand, two or more of the of the plurality of N-channel field effect transistors 371 are activated if logic levels of two or more output signals of the exclusive-OR (XOR) circuits 361 become logic high due to two or more bit errors in the read data. As a result, an error signal, which is the output signal of the AMP 376 will be at a logic low level because the second voltage of N2 node 378 is greater than the first voltage of N1 node 377. Thus, by sensing the voltage levels of the N1 node 377 and the N2 node 378 by the differential amplifier AMP 376, errors of two or more bits may be detected.

In the case of detecting one or more bits, the logic level of the 1BitDon'tCareEnable_b signal may be set to logic high. Thus, the pre-charge signal to the first P-channel field effect transistor 372 may be used to control the N1 node 377. The pre-charge signal may be set to logic low to pre-charge the N1 node 377, and then the pre-charge signal may be set to logic high. When only one of the plurality of N-channel field effect transistors 371 is activated, the N1 node 377 is at logic low. Therefore, by sensing the voltage levels of the N1 node 377 and the N2 node 378 by the differential amplifier AMP 376, one or more bit errors may be detected. The control circuit 36 may provide an error signal from an output node of the AMP 376 if a number of bit errors detected is greater than or equal to a predetermined number (e.g. a number "N" that is greater or equal to two). Alternatively, the control circuit 36 may suppress providing the error signal from the AMP 376 if the number of bit errors detected is less than the predetermined number.

Thus, by adding a circuit with a configuration as the 1BitDon'tCare circuit 37 to a conventional compression circuit, it is possible to provide two test modes, a first test mode detecting a first predetermined number (e.g., one) or more bit errors or a second test mode detecting a second predetermined number (e.g. two) or more bit errors. In FIG. 6B, the size of the additional N-channel field effect transistor 375 between the size of each of a plurality of N-channel field effect transistors 371 and twice the size of each of the plurality of N-channel field effect transistors 371 (e.g. 1.5 times) determines a threshold current for switching a number of error bits to be detected, between the first predetermined number and the second predetermined number. By appropriately selecting the size of the second P-channel field effect transistor 373, the size of the third P-channel field effect transistor 374 and the size of the additional N-channel field effect transistor 375, it may be possible to adjust the first predetermined number and the second predetermined number. The 1BitDon'tCare circuit 37 shown in FIG. 6B is merely an example of a circuit that may be used. In other embodiments, different 1BitDon'tCare circuits may be used. For example, some other channel type of transistors may be used alternatively and/or additionally to the P-channel transistors and the N-channel transistors in FIG. 6B.

When a first node (N1) coupled to a 1BitDon'tCare circuit is a long wiring, a voltage level of the N1 in proximity of input nodes of a differential amplifier may be different from a voltage level of the N1 in proximity of a transistor (e.g., Tr1 in FIG. 7B) far from the input nodes of the differential amplifier, due to wiring resistance of the N1. FIG. 7A is a block diagram of a memory cell array and a control circuit in a semiconductor memory device according to an embodiment of the present disclosure. FIG. 7B is a schematic diagram of a portion of the control circuit 42 in FIG. 7A according to an embodiment of the present disclosure. In particular, FIG. 7B shows a detail circuit configuration of the control circuit 42. The control circuit 42 provides error detection of two or more bit errors while ignoring single bit errors that may be handled by an ECC circuit outside of the control circuit 42. In a test operation, a plurality of bits (e.g., 128 bits) of read data are provided to a compression/1 Bit Don't Care circuit 46. The compression/1 Bit Don't Care circuit 46 includes a plurality of respective exclusive-OR (XOR) circuits 461 that compare the plurality of bits of data with reference data from a register 45. The compression/1 Bit Don't Care circuit 46 may include a 1BitDon'tCare circuit 47. For example, the 1BitDon'tCare circuit 47 may include a plurality of N-channel field effect transistors 471 that receives output signals of the respective exclusive-OR (XOR) circuits 461. The 1BitDon'tCare circuit 47 may also include a first P-channel field effect transistor 472 and a second P-channel field effect transistor 473 having gates coupled to a first node (N1) 477. The 1BitDon'tCare circuit 47 may further include a third P-channel field effect transistor 474 and a fourth P-channel field effect transistor 475 having gates coupled to a second node (N2) 478. A drain node of the second P-channel field effect transistor 473 is coupled to a first input node of a differential amplifier (AMP) 476. A drain node of the fourth P-channel field effect transistor 475 is coupled to a second input node of the differential amplifier (AMP) 476. The 1BitDon'tCare circuit 47 shown in FIG. 7B is merely an example of a circuit that may be used. In other embodiments, different 1BitDon'tCare circuits may be used. For example, some other channel type of transistors may be used alternatively and/or additionally to the P-channel transistors and the N-channel transistors in FIG. 7B.

In the 1BitDon'tCare circuit 47 of FIG. 7, the N node 477 and the N2 node 478 are operated in proximity of a first voltage (e.g. VDD1). The plurality of N-channel field effect transistors 471 may be operated by a second voltage (e.g. VDD2), and the first voltage VDD1 is greater than the second voltage VDD2 in this configuration. For example, VDD1 and VDD2 may be set to 1.8V and 1.2V, respectively.

Figure 7C:
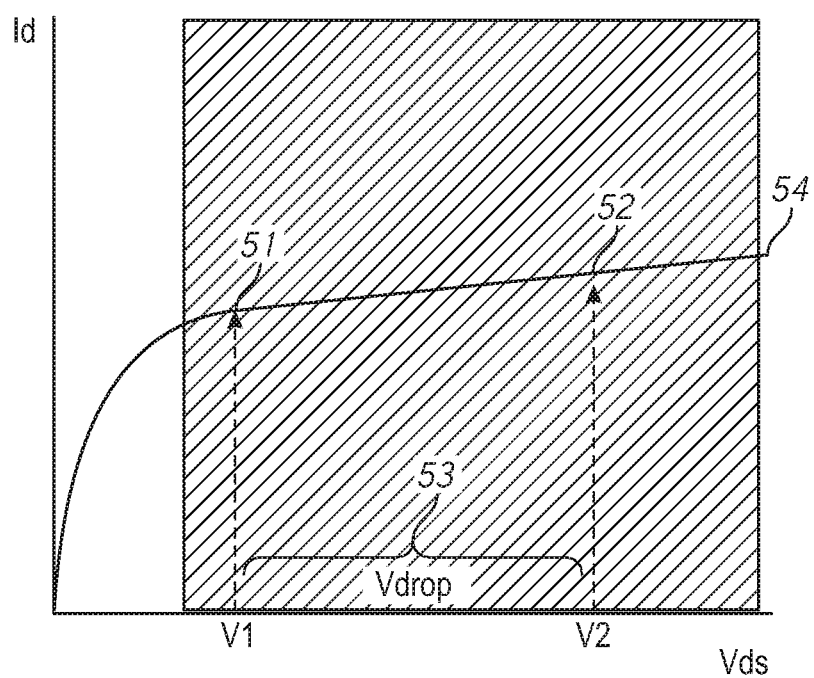
FIG. 7C is a graphic representation of a relationship between a voltage between a drain node and a source node (Vds) and a current on a drain node (Id) for the plurality of N-channel field effect transistors in FIG. 7B.

FIG. 7C is a graphic representation of a relationship between a voltage between a drain node and a source node (Vds) and a current on a drain node (Id) for the plurality of N-channel field effect transistors in FIG. 7B. In this graphic representation, a horizontal axis represents the Vds and a vertical axis represents the Id. For example, a first operation point 51 is an operation point of a first transistor (e.g., Tr1) of the N-channel field effect transistors 471 far from the AMP 476 and a second operation point 52 is an operation point of a second transistor (e.g., Tr127) of the N-channel field effect transistors 471 near the AMP 476. A voltage drop (Vdrop) 53 due to a wiring distance between the second transistor (Tr127) and the first transistor (Tr1) and may be represented by "V2−V1". When the first transistor (Tr1) and the second transistor (Tr127) receive the second voltage VDD2 at their gates, the first transistor (Tr1) and the second transistor (Tr127) operate in an active mode within a saturated region 54 where the Id does not increase sharply as the Vds increases like in the region outside of the saturated region 54. Thus, the current Ids for the first transistor (Tr1) and the second transistor (Tr127) are substantially the same regardless the voltage change "V2−V1". For example, when a diode is coupled to the first node N1 477 to form a current mirror configuration, due to the constant current flow regardless of whichever transistor among the plurality of N-channel field effect transistors 471 is turned on, the same electric potential is generated in the N1 node 477 in the current mirror configuration. A voltage of a drain node of the second P-channel field effect transistor 473 is driven by the N1 node 477. A voltage of a drain node of the fourth P-channel field effect transistor 475 is driven by an electric current of the second node (N2) 478 coupled to drain nodes of a second N-channel field effect transistor 479 and a third N-channel field effect transistor 480. The differential AMP 476 compares the voltage of the drain node of the second P-channel field effect transistor 473 with the voltage of the drain node of the fourth P-channel field effect transistor 475. The second N-channel field effect transistor 479 has a first size substantially the same as the size of each of a plurality of N-channel field effect transistors 471 and the third N-channel field effect transistor 480 has a second size smaller than the first size. Thus, a channel width of the combination of the second N-channel field effect transistor 479 and the third N-channel field effect transistor 480 is between the first size and twice the first size. In this configuration, it is possible to detect two or more bit errors while ignoring a single bit error. In this example, the first voltage VDD1 is used. It is possible to use a higher voltage than the first voltage VDD1 may be used, if necessary, when the wiring resistance is higher. While this test operation may be executed within test modes, a voltage higher than a voltage for normal operations (e.g. the first voltage VDD1) may be applied.

The differential AMP 476 may be used for the single bit error detection. When a 1BitDon'tCareEnable signal transitions, the size of the combination of the second N-channel field effect transistor 479 and the third N-channel field effect transistor 480 coupled to the N2 node 478 is switched between the second size and a sum of the first size and the second size. While the combination of the second N-channel field effect transistor 479 and the third N-channel field effect transistor 480 has the second size by deactivating the 1BitDon'tCareEnable signal, a first test mode detecting one or more bit errors may be executed. When the 1BitDon'tCareEnable signal is activated and the second N-channel field effect transistor 479 and the third N-channel field effect transistor 480 are turned on, a second test mode detecting two or more bit errors may be obtained. In the similar manner, by adjusting a size of transistors coupled to the N2 node 478, it is possible to detect a predetermined number or more of bit errors while ignoring less than the predetermined number of bit errors. Thus, modification of a conventional WiredOR circuit of a single error bit detection circuit by adding a circuit with a configuration as the 1BitDon'tCare circuit 47 with adjustment of size of transistors, a predetermined number of bit errors (e.g. a number "N" that is greater or equal to two) can be detected. The control circuit 46 may provide an error signal from an output node of the AMP 476 if a number of bit errors detected is greater than or equal to a predetermined number. Alternatively, the control circuit 46 may suppress providing the error signal from the AMP 476 if the number of bit errors detected is less than the predetermined number.

Figure 8:
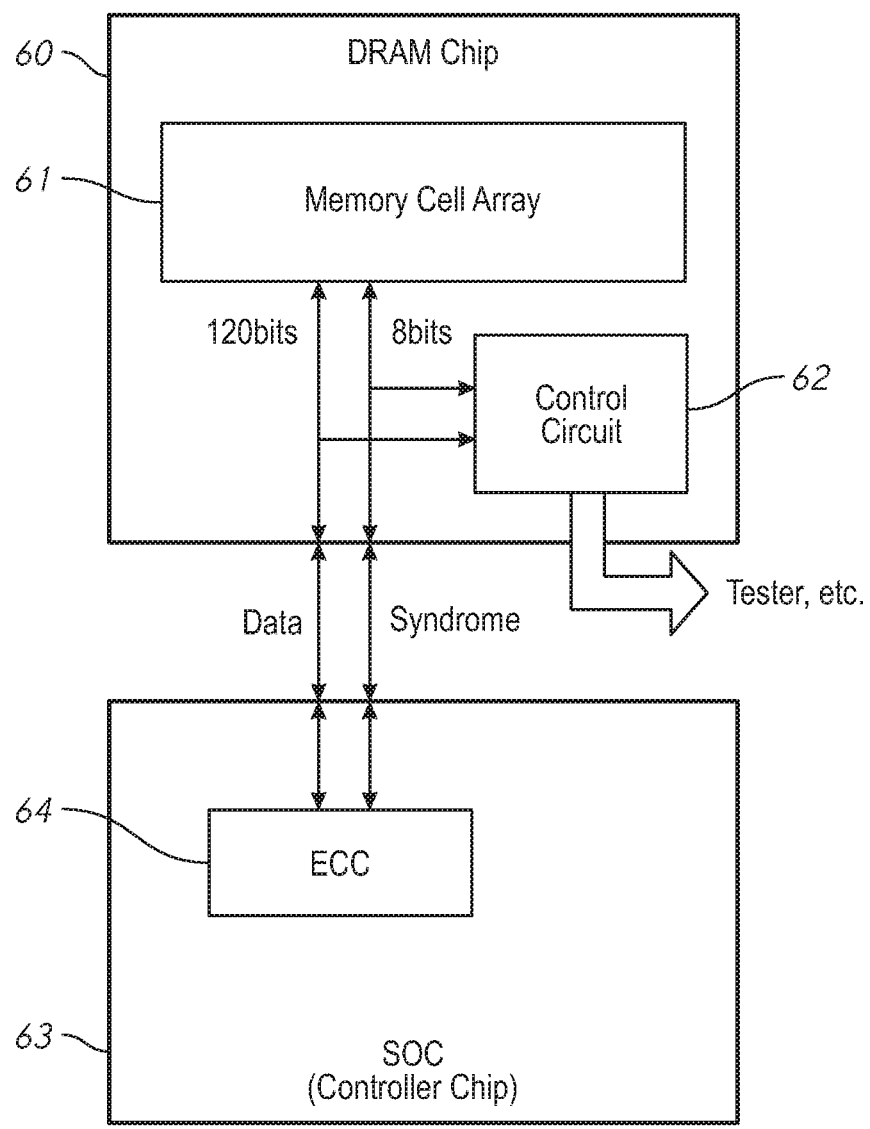
FIG. 8 is a system diagram according to an embodiment of the present disclosure.

FIG. 8 is a system diagram according to an embodiment of the present disclosure. A semiconductor memory device (e.g. a DRAM chip) 60 may include a memory cell array 61 and a control circuit 62. An output signal of the control circuit 62 may be provided directly to a tester (not shown) before being provided to a controller chip (e.g. SoC) 63 or provided to the tester after being coupled to the controller chip 63. The connection between the semiconductor memory device 60 and the controller chip 63 may be provided by stacking a plurality of semiconductor memory devices 60 with each other through "through silicon vias (TSVs)", and the output signal of the control circuit 62 may be supplied to the tester by way of one of the TSVs and the controller chip 63. The controller chip 63 includes an ECC circuit 64. When the DRAM chip is in a normal mode, the ECC circuit 64 is activated, and data and syndromes are transmitted between the memory cell array 61 and the ECC circuit 64. When the DRAM chip is in a test mode, data and syndromes may be transmitted to one of 1BitDon'tCare circuits described above in the control circuit 62 and two or more bit errors may be detected. Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    at least one memory cell array comprising a plurality of memory cells; and
    control circuit configured to receive read data from the plurality of memory cells and to compare the read data with reference data, wherein the control circuit comprises:
        a first comparison circuit configured to receive reference data and to provide a first error signal associated with a first number of bit errors based on a comparison of the reference data to the read data; and
        a second comparison circuit configured to receive the first error signal and to provide a second error signal associated with a second number of bit errors greater than the first number of bit errors.

2. The apparatus of claim 1, wherein the first number of bit errors is a first integer number, and wherein the second number of bit errors is a second integer number.

3. The apparatus of claim 2, wherein the second number of bit errors corresponds to one bit error.

4. The apparatus of claim 1, wherein the first number of bit errors is associated with a number of errors correctable by an external Error Correcting Codes (ECC) circuit.

5. The apparatus of claim 1, wherein the first comparison circuit comprises a plurality of exclusive-OR (XOR) circuits, each XOR circuit configured to receive a portion of the reference data.

6. The apparatus of claim 1, wherein the second comparison circuit comprises a plurality of transistors, each transistor configured to receive a portion of the first error signal.

7. An apparatus comprising:
    at least one memory cell array comprising a plurality of memory cells; and
    a control circuit configured to receive read data from the plurality of memory cells, configured to compare the read data with reference data, and further configured to suppress an error signal when a number of bit errors is less than an integer number of errors, wherein the control circuit comprises:
        a first comparison circuit configured to provide an intermediate error signal based on the number of bit errors being equal to or less than the integer number of errors, and
        a second comparison circuit configured to receive the first intermediate error signal and to provide a second error signal based on the first intermediate error signal.

8. The apparatus of claim 7, wherein the control circuit is configured to suppress the error signal based on the second error signal being a logic high level.

9. The apparatus of claim 7, wherein the error signal suppressed corresponds to logic low level provided by the second comparison circuit.

10. The apparatus of claim 7, wherein the first comparison circuit further configured to receive reference data from a register, the intermediate error signal based partly on the reference data.

11. An apparatus comprising:
    a memory array comprising a plurality of memory cells; and
    a control circuit configured to provide a plurality of first signals responsive to a plurality of bits of read data retrieved from the memory array, each of the plurality of first signals being configured to set to a first logic level when an error occurs in an associated one of the plurality of bits of read data and to a second logic level when no error occurs in an associated one of the plurality of bits of read data, the control circuit further configured to provide a second signal, the second signal being configured to set to a first state when a number of the first signals each setting to the first logic level is equal to or greater than a first number and to a second state when a number of the first signals each setting to the first logic level is smaller than the first number;
    wherein the first number is two or more.

12. The apparatus of claim 11, wherein the control circuit is further configured to be activated in a test operation.

13. The apparatus of claim 11, wherein the control circuit is further configured to compare the plurality of bits of read data with reference data to provide the plurality of first signals.

14. The apparatus of claim 11, wherein the control circuit comprises a plurality of first transistors coupled in parallel to each other, each of the first transistors being configured to receive an associated one of the plurality of first signals and to be rendered conductive responsive to the first logic level of the associated one of the plurality of first signals and non-conductive responsive to the second logic level of the associated one of the plurality of first signals.

15. The apparatus of claim 14, wherein the plurality of first transistors are coupled in parallel to each other between an output node and a first power supply node, and wherein the second signal is derived from the output node.

16. The apparatus of claim 15, wherein the control circuit further comprises a second transistor coupled between the output node and a second power supply node, the second transistor being larger in size than each of the plurality of first transistors.

17. The apparatus of claim 14,
wherein the plurality of first transistors are coupled in parallel to each other between a first node and a first power supply node; and
wherein the control circuit further comprises:
a second transistor coupled between the first node and a second power supply node,
a third transistor coupled between a second node and the first power supply node,
a fourth transistor coupled between the second node and the second power supply node, and
a differential amplifier coupled to the first and second nodes to provide the second signal.

18. The apparatus of claim 17, wherein the third transistor is larger in size than each of the plurality of first transistor, and wherein the second transistor is substantially equal in size to the fourth transistor.

19. The apparatus of claim 14,
wherein the plurality of first transistors are coupled in parallel to each other between a first node and a first power supply node; and
wherein the control circuit further comprises:
a first resistor configured to provide a first voltage drop thereacross responsive to a first current flowing into the first node,
at least one second transistor coupled between a second node and the first power supply node,
a second resistor configured to provide a second voltage drop thereacross responsive to a second current flowing into the second transistor, and
a differential amplifier coupled to the first and second resistors to provide the second signal.

20. The apparatus of claim 19, wherein the at least one second transistor is larger in size than each of the plurality of first transistors.

* * * * *